United States Patent
Naidu et al.

(10) Patent No.: US 10,447,030 B2
(45) Date of Patent: Oct. 15, 2019

(54) METHOD FOR PROTECTION IN A MIXED POWER TRANSMISSION LINE

(71) Applicant: ABB Schweiz AG, Baden (CH)

(72) Inventors: Obbalareddi Demudu Naidu, Bangalore (IN); Amit Purohit, Indore (IN); Vinay Kariwala, Kolkata (IN); Jianping Wang, Vasteras (SE)

(73) Assignee: ABB Schweiz AG, Baden (CH)

( * ) Notice: Subject to any disclaimer, the term of this patent is extended or adjusted under 35 U.S.C. 154(b) by 212 days.

(21) Appl. No.: 15/549,198

(22) PCT Filed: Mar. 3, 2016

(86) PCT No.: PCT/IB2016/051197
§ 371 (c)(1),
(2) Date: Aug. 7, 2017

(87) PCT Pub. No.: WO2016/139613
PCT Pub. Date: Sep. 9, 2016

(65) Prior Publication Data
US 2018/0034265 A1 Feb. 1, 2018

(30) Foreign Application Priority Data
Mar. 3, 2015 (IN) .......................... 1016/CHE/2015

(51) Int. Cl.
*H02H 7/26* (2006.01)
*G01R 31/08* (2006.01)
(Continued)

(52) U.S. Cl.
CPC .............. *H02H 7/26* (2013.01); *G01R 31/085* (2013.01); *H02H 1/0007* (2013.01); *H02H 3/06* (2013.01); *H02H 7/265* (2013.01)

(58) Field of Classification Search
CPC .......... H02H 1/0007; H02H 3/06; H02H 7/26; H02H 7/265; G01R 31/085
(Continued)

(56) References Cited

U.S. PATENT DOCUMENTS

| 4,766,549 A | 8/1988 | Schweitzer, III et al. |
| 2013/0096854 A1* | 4/2013 | Schweitzer, III .... G01R 31/085 702/59 |

(Continued)

FOREIGN PATENT DOCUMENTS

WO 2013071974 A1 5/2013

OTHER PUBLICATIONS

H. Livani at el., "A Machine Learning and Wavelet-Based Fault Location Method for Hybrid Transmission Lines", Smart Grid, IEEE Transactions on, On pp. 51-59 vol. 5, Issue: 1, Jan. 2014.
(Continued)

*Primary Examiner* — Kevin J Comber
(74) *Attorney, Agent, or Firm* — Barnes & Thornburg LLP

(57) ABSTRACT

A method is provided for protection in a mixed power transmission line by controlling a switching device connected thereto through an Intelligent Electronic Device (IED). The mixed line has two or more sections with at least one overhead section (10A) and at least one underground section (10B), wherein every two consecutive sections are connected at a junction (10C). The method is implemented by the IED (14), which receives a signal from a measurement equipment. The IED detects a travelling wave from the signal, and determines a first peak of the travelling wave and at least one a peak width, a rise time and a discharge time of the first peak. The IED identifies the section with the fault based on a comparison of at least one of the peak width, the rise time and the discharge time with a corresponding
(Continued)

threshold value of each junction, and controls the switching device based on the comparison.

9 Claims, 3 Drawing Sheets

(51) Int. Cl.
*H02H 1/00* (2006.01)
*H02H 3/06* (2006.01)

(58) Field of Classification Search
USPC .......................................................... 361/71
See application file for complete search history.

(56) References Cited

U.S. PATENT DOCUMENTS

| 2015/0081234 A1* | 3/2015 | Schweitzer, III | .... G01R 31/088 |
| | | | 702/58 |
| 2015/0081235 A1* | 3/2015 | Schweitzer, III | .... G01R 31/088 |
| | | | 702/59 |
| 2015/0081236 A1* | 3/2015 | Schweitzer, III | ...... G01R 27/16 |
| | | | 702/59 |

OTHER PUBLICATIONS

International Search Report, International Application No. PCT/IB2016/051197, search completed May 30, 2016, 4 pages.
Written Opinion issued by the International Searching Authority in connection with International Application No. PCT/IB2016/051197, dated May 30, 2016, 6 pages.

* cited by examiner

METHOD FOR PROTECTION IN A MIXED POWER TRANSMISSION LINE

CROSS-REFERENCE TO RELATED APPLICATIONS

This application is a U.S. national stage of International Application Serial No. PCT/IB2016/051197, filed Mar. 3, 2016, which claims priority to Indian Patent Application No. 1016/CHE/2015, filed Mar. 3, 2016. The entire disclosures of both of the foregoing applications are hereby incorporated by reference.

FIELD OF THE INVENTION

The present invention relates to fault protection in a mixed power transmission line.

BACKGROUND OF THE INVENTION

A mixed power transmission line is a transmission line that consists of overhead and underground line sections. At the very least, a mixed power transmission line has one overhead line section and one underground line section. Such a transmission line is preferred over a homogenous transmission line (i.e. a line that has only an overhead section(s), or a line which only consists of an underground cable(s)) for a variety of reasons including, but not limited to, safety considerations, ease of accessibility of substations in thickly populated locations, ease of grid connection between countries with varying topology, and need for subsea electrification. An example where a mixed power transmission line is preferred instead of a homogenous transmission line, is when the transmission line is expected to traverse across natural vegetation, rivers etc.

As in case of a homogenous transmission line, faults may occur in a mixed power transmission line. Overhead sections of the mixed power transmission line are more prone to faults as they are exposed to disturbances such as lightning strikes, wind-borne debris and the like. In case of homogenous transmission lines, an auto-reclose functionality is utilized, albeit depending upon the type (underground/overhead) of the homogenous transmission line. A switching device such as a circuit breaker, or an auto-recloser may be utilized for the purpose of disconnecting a faulty line from the rest of the power transmission network, thereby mitigating the risk associated with propagation of a fault(s). Typically, the faults that occur in overhead transmission lines are transient (temporary) in nature, and therefore, such transient faults can be dealt with using an auto-recloser. However, in case of underground transmission lines, which are more prone to permanent faults, auto-recloser functionality cannot be used.

Therefore, in case of power transmission networks comprising mixed transmission lines, auto-reclosers need to be controlled in a selective manner. In case of occurrence of fault in an underground section, the auto-recloser operation should be disabled, given the permanent nature of the fault. Therefore, there was felt a need for a system and method that is effective and efficient in terms of identifying an occurrence of a fault in a mixed power transmission line, and providing for appropriate and efficient protection.

SUMMARY OF THE INVENTION

Various aspects of the present invention provide a method and system for protection in response to a fault in a mixed power transmission line (hereafter referred to as 'mixed line'). For example, there may be electrical faults in the mixed line due to disturbances like as lightning strikes, wind-borne debris etc. In such a case, a portion of the line or the entire line may be disconnected from the rest of power transmission network to prevent propagation of faults/damage to electrical equipment. The protection is enabled by controlling a switching device connected to the mixed line through an Intelligent Electronic Device (IED). The switching device may be a circuit breaker or an auto-recloser. Controlling a switching device includes operating the switching device.

The mixed line comprises two or more sections with at least one overhead section and at least one underground section. The mixed line may be an A/C line. Each section of the two or more sections is one of an overhead section and an underground section. For example, the mixed line can have two sections, with one of the two sections being an overhead section, and the other section being an underground section. Every two consecutive sections of the mixed line are connected at a junction. Accordingly, in case of a mixed line with two sections (e.g. line with one overhead section and one underground section), there is one junction, in case of a line with three sections (e.g. line with two overhead sections and one underground sections), there are two junctions and so forth.

The method is implemented by the IED of the mixed line. For example, the method may be implemented by an IED associated with a section, a junction, a substation and so forth. In accordance with the method, the IED receives a signal from a measurement equipment connected to the mixed line. For example, the measurement equipment can be a current transformer, a potential transformer, a sensor-based measurement equipment (e.g. Rogowski coils) and/or the like, which provides a signal corresponding to current, voltage or other information as sensed from the mixed line.

The IED performs the step of detecting a travelling wave from the signal received from the measurement equipment. As an example, a current signal may be digitized and processed by the IED to detect a travelling wave. The travelling wave is typically generated due to the fault in a section of the two or more sections of the mixed line. The IED also determines a first peak of the travelling wave, and at least one a peak width, a rise time and a discharge time of the first peak.

The IED identifies the section with the fault based on a comparison of at least one of the peak width, the rise time and the discharge time with a corresponding threshold value of each junction. For example, the peak width can be compared with a threshold value of a junction, and depending on whether the peak width is lesser, or greater than the threshold value, it may be determined that the fault lies in an overhead or underground section. Taking another example, a peak characteristic may lie in a particular range, and accordingly the fault may be determined in a particular section of the mixed line. Take a case where the mixed power transmission line comprises two sections. Here, an overhead section of the two sections may be identified as the section with the fault if at least one of the peak width, the rise time and the discharge time is less than the corresponding threshold value. Alternately, an underground section of the two sections is identified as the section with the fault if at least one of the peak width, the rise time and the discharge time is greater than the corresponding threshold value. The determination of which section has the fault may also depend on the ordering of the sections with respect to the IED.

The corresponding threshold value is predetermined for each junction and is stored in the IED. Here, the corresponding threshold value is predetermined for each junction based on one or more of an analysis of a history of information associated with one or more faults at the junction, fine-tuning of a default value over a period of time, and electrical characteristics of the mixed power transmission line. For example, fault characteristics of a junction(s) of the mixed line may be determined at the time of installation of the mixed line, and such characteristics may be used for defining the threshold value(s) for the junction. Taking another example, experiments may be conducted for determining the threshold value(s) for the junction. Such experiments can include physically/virtually simulating faults for a line. Taking yet another example, the threshold for a junction(s) may be set as a default value in the beginning, and later fine-tuned according to actual values collected upon occurrence of a fault(s).

The IED performs the step of controlling the switching device based on the section with the fault identified based on the comparison, for protection in response to the fault. For example, the IED sends a command to enable operation of an auto-recloser if an overhead section is detected to be faulty. Taking another example, the IED sends a command to disable operation of the auto-recloser if an underground section is detected to be faulty.

BRIEF DESCRIPTION OF DRAWINGS

The subject matter of the invention will be explained in more detail in the following text with reference to exemplary embodiments which are illustrated in attached drawings in which.

DETAILED DESCRIPTION

The present invention envisages a system and method for protection in response to a fault in a mixed power transmission line (referred to as 'mixed line' hereafter). The mixed line typically includes at least one underground section and at least one overhead section. Two consecutive sections in a mixed line are connected at a junction.

Figure 1:
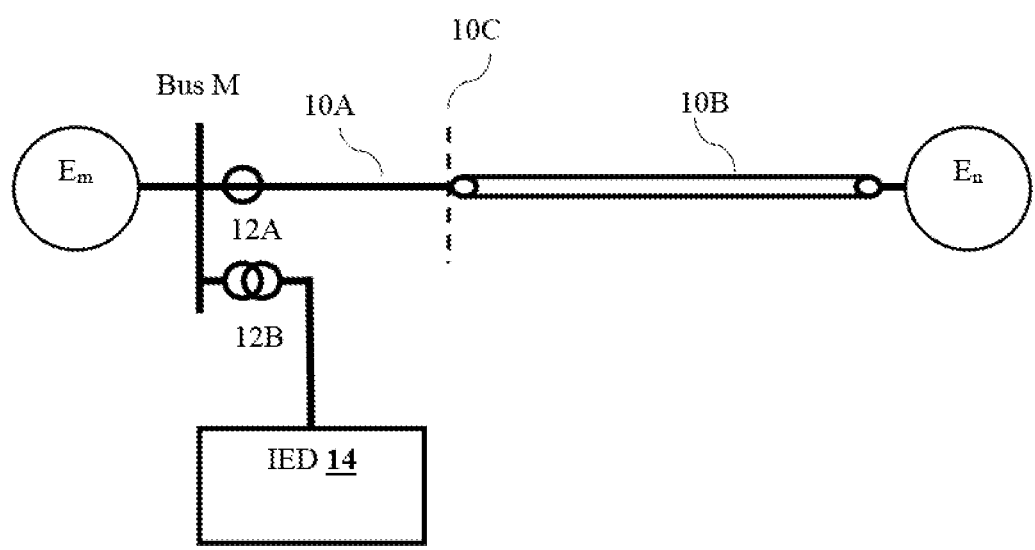
FIG. 1 is a simplified diagram of a system for protection in response to a fault in a mixed power transmission line, in accordance with an embodiment of the invention.

FIG. 1 illustrates a first embodiment of the present invention, wherein there is shown a mixed line comprising an overhead section and as underground section. The mixed line in accordance with the embodiment includes one overhead section denoted by a reference numeral 10A, and one underground section denoted by a reference numeral 10B. Further, the overhead section 10A is connected to the underground section 10B at a junction 10C. The mixed line connects two substations Em and En, as shown in FIG. 1. The overhead section 10A originates at the substation Em and the underground section 10B terminates at the substation En as shown in FIG. 1. As shown in FIG. 1, the measurement equipment is connected to the substation Em. Measurement equipment may be connected at one or more of the substations Em and En. The measurement equipment may be a Current Transformer (CT), a Potential Transformer (PT), a sensor-based measurement equipment etc.

In accordance with the embodiment shown in FIG. 1, the measurement equipment includes a current transformer 12A and a voltage transformer 12B. Again referring to FIG. 1, an Intelligent Electronic Device (IED) 14 is connected to voltage transformer 12B. However, IED 14 may be connected with the current transformer, or it may receive a signal from other equipment.

In accordance with the present invention, whenever a fault occurs at any section of the mixed line, travelling waves are generated as a consequence of occurrence of the fault. In order to detect travelling waves, the signal(s) from the measurement equipment are monitored, preferably continuously. For example, IED 14 monitors the signal received from either the current transformer 12A or potential transformer 12B (depending upon whether current signals are to be sensed or voltage signals are to be sensed). Typically, the current transformer 12A senses current of the mixed line, while the potential transformer 12B senses voltage of the mixed line. The measurement corresponds to the point in the mixed line, wherein the measurement equipment is connected. In case of AC line, the measurement will reflect current/voltage for each phase (of the multi-phase line).

In accordance with the present invention, the signal is digitized and processed by the IED 14, to detect a travelling wave therefrom. At the IED 14, Clark transformation is applied either to the current signal or the voltage signal. Subsequently aerial mode (alpha component or beta component) and ground mode components of the (current or voltage) signal are obtained. The alpha component or beta component is input to a second order band pass/low pass filter (e.g. Butterworth filter). The band pass/low pass filter is used to filter out unwanted noise, and extract the travelling waves within a predetermined frequency band. The upper cut-off frequency and the lower cut-off frequency for the band pass/low pass filter are set as per the sampling frequency. The output of the band pass/low pass filter is then input to a second order mid-reject filter, whose output provides the travelling wave (signal). This process can be applied for a single phase, or repeated for each phase in a multi-phase line. Accordingly, the IED can implement the method for single phase A/C line as well as three-phase A/C line.

The IED 14 also determines the travelling wave characteristics. A first peak of the travelling wave is taken into consideration by the IED 14, given the fact that the current measurements and/or voltage measurements corresponding to second, third and further peaks are typically prone to errors and disturbances. The IED 14 determines at least one of a peak width, rise time and discharge time, of the first peak of the extracted travelling wave. Subsequently, the IED 14 compares one or more of the peak width, rise time and discharge time, with the corresponding threshold value for the peak width, rise time and discharge time stored therein (stored in IED 14). The threshold values for peak width, rise time and discharge time are predetermined for the junction 10C (or multiple junctions as the case may be).

The IED 14, post comparison of at least one of the values of peak width, rise time and discharge time, with the corresponding threshold value, determines whether the compared value(s) is less or more than the threshold value(s). In the event that at least one of the values of peak width, rise time and discharge time is lesser than the corresponding threshold value, the IED 14 determines the overhead section 10A to be faulty. Otherwise, in the event that the IED 14 determines at least one of the values of peak width, rise time and discharge time to be greater than the corresponding threshold value, then the IED 14 identifies the underground section 10B to be faulty. This is in case of a mixed line having two sections. Also, it is assumed that the section of the line closer to the IED 14 is the overhead section, and the section distant from the IED 14 is the underground section.

In case of a mixed line with multiple sections, a peak characteristic value (i.e. value of one of peak width, rise time, discharge time etc.) is compared with the threshold values for the different junctions, and the section with the fault is identified to be the section that precedes the junction for which the peak characteristic value exceeds the threshold value. Take a case of a line with junctions j1, j2, . . . jn, wherein tpd1, trt1, tdt1, tpd2, trt2, tdt2, . . . tpdn, trtn, tdtn represents the threshold values of peak width, rise time and discharge time for j1, j2 . . . jn respectively. Here, the first peak characteristic (say PDf is compared with tpd1, tpd2 . . . tpdn). Assume that PDf<tp2 and PDf>tp3. Accordingly, IED 14 identifies that the fault is in the third section that lies between j2 and j3. It will be apparent that there may be different ways in which the threshold values may be used for comparing with the actual values and identifying the section with the fault.

Subsequently, the IED 14 communicates with a switching device (not shown in figures) to enable (or continue performing)/disable a protection function in the mixed line. The switching device may be an auto-recloser, which is controlled by the IED 14. Further, the auto-reclose functionality may be continued only in the event that the overhead section (e.g. 10A) is determined to be faulty. Otherwise, if the underground section 10B is determined to be faulty, the auto-reclose functionality is disabled (i.e. auto-recloser opens after a fault and does not reclose). This is because a fault occurring in the underground section is typically long lasting, and immune to automatic rectification, and hence necessitates rectification measures to be manually implemented post a shutdown of the (underground) section. Therefore, in case of the underground section 10B being determined as faulty, switching device is utilized to isolate the (underground) section having the fault, from the remaining sections of the mixed transmission line.

Figure 2:
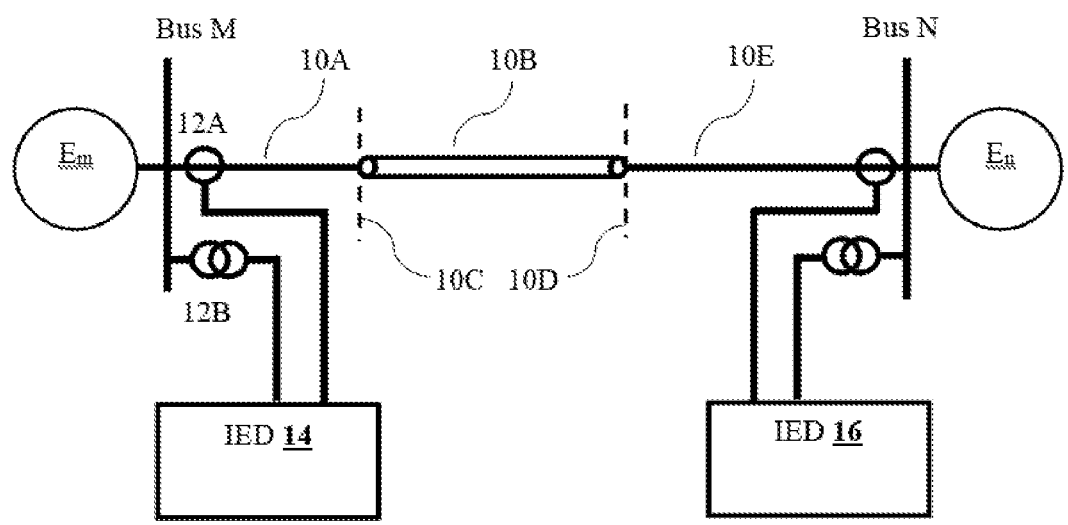
FIG. 2 is a simplified diagram of the system for protection in response to the fault in the mixed power transmission line, in accordance with another embodiment of the invention.

Referring to FIG. 2, there is shown a mixed power transmission line comprising a first overhead section 10A, an underground section 10B, and a second overhead section 10E. As shown, first overhead section 10A is electrically connected to underground section 10B via a junction 10C. Further, the underground section 10B is electrically connected to the second overhead section 10E via a junction 10D. Also, as shown, the mixed line 100A connects two substations Em and En, wherein the first overhead section 10A originates at substation Em, and terminates at junction 10c, from the underground section originates. The underground section terminates at junction 10D, from where the second overhead section 10E originates. The second overhead section 10E terminates at substation En. Measurement equipment 12 and 14 may be connected at buses of substations Em and En, as shown in FIG. 2.

The measurement equipment may include a current transformer 12A and a voltage transformer 12B, and the measurement equipment may include a current transformer 14A and a voltage transformer 14B. The signal(s) from 12A and/or 12B may be processed by IED 14. Similarly, IED 16 may process the signal from 14A and/or 14B. The processing performed at either IED 14 or IED 16, is for identifying the section with the fault based on travelling wave characteristics (similar to the process of identifying the section with the fault described above with respect to FIG. 1).

In the embodiment illustrated in FIG. 2, IED 14 and IED 16 work independently. Each IED identifies the section with the fault based on the processing the IED performs according to the signal it receives. Therefore, IED 14 may identify the section with the fault based on analysis of signal from 12A/12B. Likewise, IED 16 may identify the section with the fault based on analysis of signal from 14A/14B. The processing performed by the IEDs is for identifying the section with the fault based on identification and comparison of travelling wave characteristics, as described hereinabove (refer description of FIG. 1).

Figure 3:
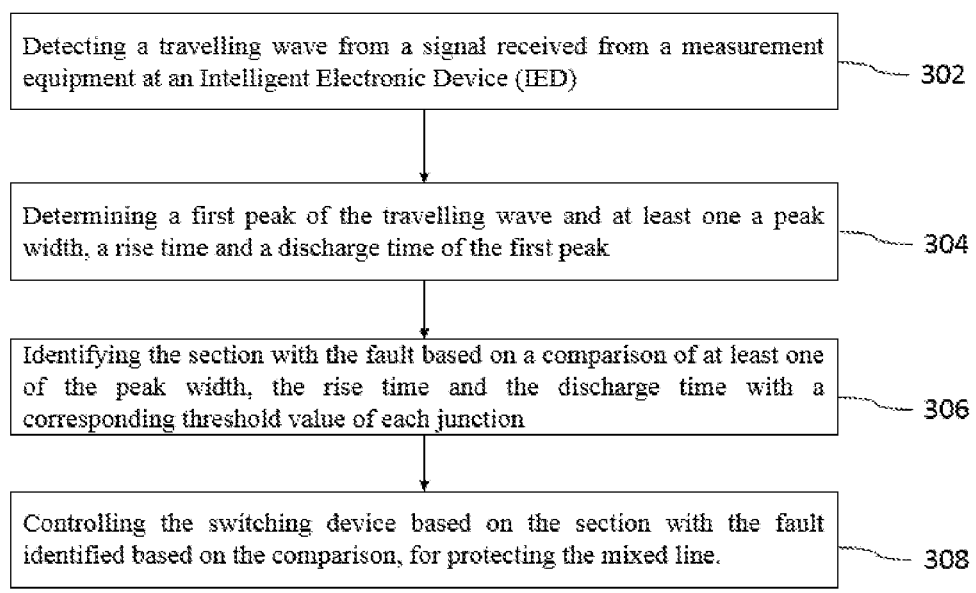
FIG. 3 is a flowchart of a method for protection in response to the fault in the mixed power transmission line, in accordance with an embodiment of the invention.

Referring to FIG. 3, which illustrates a flowchart of a method for protection in response to a fault in a mixed power transmission line (such as mixed line described in conjunction with FIG. 1 and FIG. 2). The method may be implemented by an IED (such as IED 14 or 16). The IED may be located at a section, a junction, a substation etc. Also, the IED is connected with a measurement equipment such as a current transformer, potential transformer, a sensor-based measurement equipment etc. The IED receives a signal from the measurement equipment. As described above, the signal may be of current, voltage or other electrical parameter sensed from the mixed line.

At 302, the IED detects a travelling wave from the signal. The IED digitizes and processes the signal to detect the travelling wave (refer description of FIG. 1 regarding detection of travelling wave). At 304 determines a first peak of the travelling wave and at least one of a peak width, a rise time and a discharge time of the first peak (again refer description of FIG. 1). Thereafter, at 306, the IED compares one or more of the peak width, the rise time and the discharge time with a corresponding threshold value for each junction. For example, in case of a line with one junction, the IED compares the peak width, the rise time and the discharge time with the threshold for peak width, the threshold for rise time and the threshold for discharge time for the junction. Here, depending on whether the compared value is less than or greater than the corresponding threshold value, the fault is determined to be in the overhead or underground section respectively.

In case, the line has multiple junctions, the IED compares the peak characteristic value with the threshold values of various junctions to determine which section has the fault. At 308, the IED controls a switching device (e.g. auto-recloser) according to the identified section. For example, the auto-recloser operation may be enabled by the IED if the section having the fault is an overhead section. Here, enabled means that the auto-recloser works normally, and clears momentary faults in the overhead section. Taking another example, wherein the auto-recloser operation is disabled if the section having the fault is an underground section. Here, disabled means that the auto-recloser will open on detection of the fault, and will not reclose (the fault being considered as not momentary).

The advantages envisaged by the present invention include the realization of a system and method for effective and efficient fault section identification, in a mixed power transmission line. The system and method also provide for selective enablement of auto-reclosing functionality across the mixed line, depending upon the location (i.e. section) of the fault. The present invention provides protection from measurement made by one IED, wherein the IED may be located at a section, a junction, or a terminal, without having to use measurements made at other locations.

The invention claimed is:

1. A method for protection in response to a fault in a mixed power transmission line by controlling a switching device connected to the mixed power transmission line through an Intelligent Electronic Device (IED), the mixed power transmission line comprising two or more sections with at least one overhead section and at least one underground section, each section of the two or more sections being one of an overhead section and an underground section, wherein every two consecutive sections of the mixed power transmission line are connected at a junction, the method being implemented by the IED of the mixed power transmission line, wherein the IED receives a signal from a measurement equipment connected to the mixed power transmission line, the IED performing:

detecting a travelling wave from the signal received from the measurement equipment, wherein the travelling wave is generated due to the fault in a section of the two or more sections of the mixed power transmission line;

determining a first peak of the travelling wave and at least one a peak width, a rise time and a discharge time of the first peak;

identifying the section with the fault based on a comparison of at least one of the peak width, the rise time and the discharge time with a corresponding threshold value of each junction, wherein the corresponding threshold value is predetermined for each junction and is stored in the IED; and controlling the switching device based on the section with the fault identified based on the comparison, for protecting the mixed line.

2. The method of claim 1, wherein the mixed power transmission line comprises two sections, and an overhead section of the two sections is identified as the section with the fault if at least one of the peak width, the rise time and the discharge time is less than the corresponding threshold value.

3. The method of claim 1, wherein the mixed power transmission line comprises two sections, and an underground section of the two sections is identified as the section with the fault if at least one of the peak width, the rise time and the discharge time is greater than the corresponding threshold value.

4. The method of claim 1, wherein the corresponding threshold value is predetermined for each junction based on one or more of an analysis of a history of information associated with one or more faults at the junction, fine-tuning of a default value over a period of time, and electrical characteristics of the mixed power transmission line.

5. The method of claim 1, wherein the switching device is an auto-recloser.

6. The method of claim 5, wherein the auto-recloser operation is enabled on the section with the fault identified being an overhead section.

7. The method of claim 5, wherein the auto-recloser operation is disabled on the section with the fault identified being an underground section.

8. The method of claim 1, wherein the switching device is a circuit breaker.

9. The method of claim 1, wherein the mixed power transmission line connects two substations, and the IED operates from one of the two substations.

\* \* \* \* \*